United States Patent
McGraw et al.

(10) Patent No.: US 10,888,012 B2
(45) Date of Patent: Jan. 5, 2021

(54) PRINTED CIRCUIT BOARD ORIENTATIONS

(71) Applicant: Hewlett Packard Enterprise Development LP, Houston, TX (US)

(72) Inventors: Montgomery C. McGraw, Magnolia, TX (US); Troy Anthony Della Fiora, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/413,903

(22) Filed: May 16, 2019

(65) Prior Publication Data
US 2020/0367380 A1 Nov. 19, 2020

(51) Int. Cl.
*H05K 7/20* (2006.01)
*H05K 7/14* (2006.01)
*H05K 1/14* (2006.01)

(52) U.S. Cl.
CPC ........... *H05K 7/1487* (2013.01); *H05K 1/144* (2013.01); *H05K 7/1421* (2013.01); *H05K 7/1489* (2013.01); *H05K 7/20736* (2013.01); *H05K 2201/10159* (2013.01); *H05K 2201/10378* (2013.01)

(58) Field of Classification Search
CPC .. H05K 7/1411; H05K 7/1421; H05K 7/1422; H05K 7/1444; H05K 7/1489
USPC .................................................. 361/724–735
See application file for complete search history.

(56) References Cited

U.S. PATENT DOCUMENTS

| | | | | |
|---|---|---|---|---|
| 5,645,434 A | * | 7/1997 | Leung | H01R 31/005 439/74 |
| 7,035,111 B1 | * | 4/2006 | Lin | G06F 1/18 361/748 |
| 7,039,299 B2 | * | 5/2006 | Onodera | G11B 33/128 360/133 |
| 7,200,008 B1 | * | 4/2007 | Bhugra | G11B 25/043 361/679.21 |
| 7,280,373 B2 | * | 10/2007 | Aizawa | G06F 1/184 361/792 |

(Continued)

OTHER PUBLICATIONS

"Architecture and Technologies in the HPE BladeSystem C7000 Enclosure," Technical White Paper, 2013-2014, 2017-2018, 4AA4-8125ENW, Oct. 2018, Rev. 4, <https://h20195.www2.hpe.com/v2/getpdf.aspx/4aa4-8125enw.pdf>.

(Continued)

*Primary Examiner* — Anthony Q Edwards
(74) *Attorney, Agent, or Firm* — Hewlett Packard Enterprise Patent Department

(57) ABSTRACT

An example computing device enclosure can include a first printed circuit board (PCB) that includes a first plurality of components, where a first portion of the first plurality of components that are shorter than a threshold height are positioned on a first side of the first PCB and a second portion of the first plurality of components that are taller than the threshold height are positioned on a second side of the first PCB, and a second printed circuit board (PCB) that includes a second plurality of components, where a first portion of the second plurality of components that are shorter than the threshold height are positioned on a first side of the second PCB and a second portion of the second plurality of components that are taller than the threshold height are positioned on a second side of the second PCB.

18 Claims, 7 Drawing Sheets

(56) References Cited

U.S. PATENT DOCUMENTS

| | | | | |
|---|---|---|---|---|
| 7,304,855 B1* | 12/2007 | Milligan | G11B 33/128 | |
| | | | 361/724 | |
| 7,499,282 B1* | 3/2009 | Loucks | G06F 1/1626 | |
| | | | 361/730 | |
| 7,778,020 B2* | 8/2010 | Flynn | G06F 1/183 | |
| | | | 312/223.1 | |
| 8,665,599 B2* | 3/2014 | Shen | H02J 7/0045 | |
| | | | 361/301.4 | |
| 8,797,732 B2* | 8/2014 | Ganta Papa Rao Bala | | |
| | | | G11B 33/128 | |
| | | | 361/679.32 | |
| 9,055,690 B2* | 6/2015 | Ross | H05K 7/1487 | |
| 9,141,156 B2* | 9/2015 | Ross | G06F 1/20 | |
| 9,367,106 B2* | 6/2016 | Alshinnawi | G06F 1/183 | |
| 9,437,943 B1* | 9/2016 | Davis | H05K 3/368 | |
| 9,532,480 B2* | 12/2016 | Shen | G06F 1/187 | |
| 9,727,127 B2* | 8/2017 | Apro | H05K 7/14 | |
| 10,028,401 B2 | 7/2018 | Shaw | | |
| 10,101,769 B2 | 10/2018 | Arnouse | | |
| 10,178,807 B2* | 1/2019 | Conn | H05K 7/1485 | |
| 2005/0041386 A1* | 2/2005 | Walczak | G06F 1/18 | |
| | | | 361/679.37 | |
| 2007/0230111 A1* | 10/2007 | Starr | G11B 33/125 | |
| | | | 361/679.31 | |
| 2008/0137284 A1* | 6/2008 | Flynn | G06F 1/183 | |
| | | | 361/679.32 | |
| 2011/0007464 A1* | 1/2011 | Leigh | H01R 13/514 | |
| | | | 361/679.01 | |
| 2012/0262861 A1 | 10/2012 | Lin | | |
| 2016/0057885 A1* | 2/2016 | Conn | G06F 1/183 | |
| | | | 211/26 | |
| 2016/0255740 A1* | 9/2016 | Ping | G06F 3/0647 | |
| | | | 710/301 | |
| 2017/0251560 A1* | 8/2017 | Spencer | H05K 7/1489 | |

OTHER PUBLICATIONS

"HPE Synergy Management Infrastructure," Technical White Paper, 4AA6-3754ENW, Feb. 2016, <http://www.hpezone.com/assets/pdf/Whitepaper%20HPE%20Synergy%20Management%20Infrastructure.pdf>.

* cited by examiner

PRINTED CIRCUIT BOARD ORIENTATIONS

BACKGROUND

A computing device can include components such as memory resources, processing resources, and/or other components that are coupled to a printed circuit board (PCB) and/or printed circuit assembly (PCA). In some examples, the computing device can be positioned within an enclosure and/or rack assembly to store the computing device during use. For example, the computing device can be a server that is positioned within a server rack assembly.

DETAILED DESCRIPTION

Figure 1:
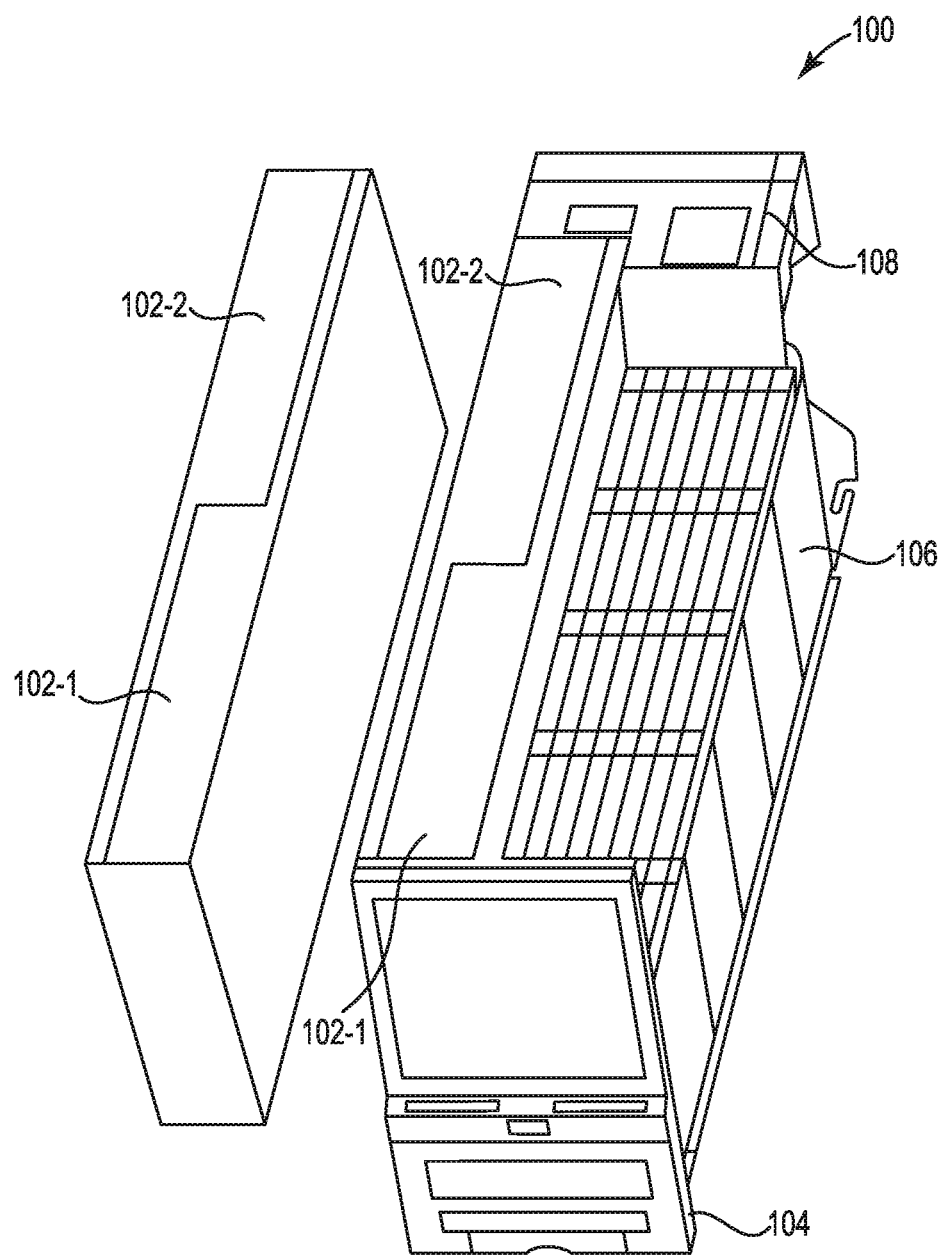
FIG. 1 is an example computing device enclosure consistent with the present disclosure.

Computing devices can include a printed circuit board (PCB) and/or a printed circuit assembly (PCA) that includes a plurality of components that can perform functions associated with the computing devices. For example, a computing device can include processing resources, input/output instructions, expansion cards, cooling resources, and/or memory resources coupled to a PCB. In some examples, a computing device can be stored within an enclosure such as a computing device enclosure while utilizing the computing device to perform functions. For example, the computing device can be positioned within a computing device enclosure drawer with other computing device components (e.g., other computing devices, cooling devices, memory resources, input/output interposers, management devices, etc.).

In some examples, computing device enclosures such as computing device enclosure drawers can have limited physical space for storing computing devices and/or memory resources. In some examples, storing a relatively larger quantity of computing devices and/or memory resources can provide a greater quantity of computing resources within the same physical footprint of the computing device enclosures. The present disclosure includes PCB orientations that can allow more computing devices and/or memory resources to be stored and utilized within a particular computing device enclosure. For example, the present disclosure can include positioning a plurality of computing devices within a particular computing device enclosure such that more computing devices and/or memory resources can be positioned within the particular computing device enclosure.

In some examples, the orientation of a first computing device can include components that are relatively tall positioned on a first side of a PCB and components that are relatively short positioned on a second side of the PCB. In this way, a second computing device can be positioned directly next to the first computing device when the second computing device includes components that are relatively short positioned on a first side of a PCB and components that are relatively tall positioned on a second side of the PCB. In this example, the relatively tall side of the first computing device can be positioned next to a relatively short side of the second computing device to allow the first computing device and the second computing device to take up relatively less physical space compared to previous devices and systems. In this way, the present disclosure can utilize more physical space for additional computing devices and/or memory resources.

Some examples of the present disclosure can provide additional physical space within a computing device enclosure to allow for additional computing devices or other computing components to be positioned within the computing device enclosure. The present disclosure also provides for top loading computing device enclosures (e.g., server enclosure drawer, slide mounted enclosure drawer, etc.) to utilize more computing resources within the top loading computing device enclosure while still providing front to back or back to front cooling of the computing devices within the top loading computing device enclosure.

FIG. 1 is an example computing device enclosure 100 consistent with the present disclosure. In some examples, the computing device enclosure 100 can be a computing device enclosure drawer that can include an enclosure area to receive and store a plurality of computing devices, such as computing devices 102-1, 102-2, and/or a plurality of memory resources such as memory resources 106. In some examples, the computing device enclosure 100 can be coupled to a rail system to allow the computing device enclosure 100 to be moved from an open position to expose the computing devices 102-1, 102-2 and/or the memory resources 106 to a closed position within a computing device rack to enclose the computing devices 102-1, 102-2 and/or memory resources 106. In some examples, the first PCB from the first computing device 102-1, the second PCB from the second computing device 102-2, and the plurality of memory resources 106 can be positioned within a removable tray that allows access to the first PCB from the first computing device 102-1, the second PCB from the second computing device 102-2, and the plurality of memory resources 106.

In some examples, the computing device enclosure 100 can include a first computing device 102-1 and a second computing device 102-2. In some examples, the first computing device 102-1 and the second computing device 102-2 can be utilized to manage data stored on the memory resources 106. For example, the first computing device 102-1 can manage storage and retrieval of data associated with a first portion of the memory resources 106 and the second computing device 102-2 can manage storage and retrieval of data associated with a second portion of the memory resources 106.

In some examples, the first PCB of the first computing device 102-1 can be a first controller for a plurality of memory resources 106 and the second PCB of the second computing device 102-2 can be a second controller for the plurality of memory resources 106. As used herein, a controller or controller PCB can be a hardware computing device that controls or manages the functions of a different device or system. In some examples, the first PCB of the first computing device 102-1 can be coupled to the plurality of memory resources 106 through a first fabric and the second PCB of the second computing device 102-2 can be coupled to the plurality of memory resources 106 through a second fabric. As used herein, a fabric can include communication links that interconnect a plurality of nodes (e.g., computing devices 102-1, 102-2, memory resources 106, etc.).

As used herein, memory resources, such as the plurality of memory resources 106 may be any electronic, magnetic, optical, or other physical storage apparatus to contain or store information such as executable instructions, data, and the like. For example, any machine-readable storage medium described herein may be any of Random Access Memory (RAM), Read-Only Memory (ROM), volatile memory, non-volatile memory, flash memory, a storage drive (e.g., hard drive, etc.), and/or a solid state drive. The plurality of memory resources 106 can be physical devices that can be utilized by computing devices such as computing devices 102-1, 102-2 to temporarily or permanently store information. In some examples, the memory resources can be non-volatile memory express (NVMe) drives or NVMe memory resources. In some examples, the NVMe memory resources can be hot plug NVMe memory resources. As used herein, a hot plug NVMe memory resource includes an NVMe memory resource that is capable of being added or removed from a computing system while the computing system is operating (e.g., computing system or computing device is activated and performing functions, etc.).

In some examples, the second computing device 102-2 can be positioned at or near an edge of the computing device enclosure 100. In some examples, the second computing device 102-2 can extend from a front portion 104 of the computing device enclosure 100 to a rear portion 108 of the computing device enclosure. As used herein, the front portion 104 of the computing device enclosure 100 can be a portion of the computing device enclosure 100 that is exposed when the computing device enclosure 100 is in the closed position. As used herein, the rear portion 108 can be a portion of the computing device enclosure 100 that is positioned within a rack or enclosure that stores the computing device enclosure 100.

In some examples, the second computing device 102-2 can be positioned with a printed circuit board (PCB) positioned toward the edge of the computing device enclosure 100 (e.g., left edge of the computing device enclosure 100 as illustrated in FIG. 1, etc.). In some examples, the PCB of the second computing device 102-2 can include components that are coupled or attached to the PCB. For example, the second computing device can include components coupled to the PCB such as, but not limited to: processing resources, memory resources, random access memory resources, heat sinks, connections, etc. In some examples, the components coupled to the PCB of the second computing device 102-2 can be directed away from the edge adjacent to the PCB of the second computing device 102-2.

In some examples, the first computing device 102-1 can be a similar device as the second computing device 102-2. For example, the first computing device 102-1 can include a PCB with components coupled to the PCB. In some examples, the first computing device 102-1 can extend from the front portion 104 to the rear portion 108 of the computing device enclosure 100. In some examples, the first computing device 102-1 can be positioned such that the PCB is positioned or directed away from the second computing device 102-2 and the components of the first computing device 102-1 are positioned or directed toward the second computing device 102-2. In this way, the components from the second computing device 102-2 can be directed toward the components of the first computing device 102-1 and vice versa. Thus, the first computing device 102-1 and the second computing device 102-2 can create a "sandwich" structure with the PCB of the first computing device 102-1 being a first side, the PCB of the second computing device 102-2 being a second side, and the components from the first computing device 102-1 and the second computing device 102-2 being between the first side and the second side.

In some examples, the components from the first computing device 102-1 can be positioned on the PCB of the first computing device based on a height of the components. As used herein, a height of a component can be a distance from the PCB to a surface of the component that extends in a perpendicular direction from the PCB. For example, a height of a heat sink can be the distance the heat sink extends away from a PCB. In some examples, the PCB of the first computing device can be split into a first side and a second side. In these examples, the first side can include components that are taller than a height threshold and the second side can include components that are shorter than the height threshold. In this way, the first computing device can include a first side with relatively tall computing components and a second side with relatively short computing components.

In some examples, the second computing device 102-2 can include components that are positioned on the PCB of the second computing device 102-2 similar to the components positioned on the PCB of the first computing device 102-1. In some examples, the second computing device 102-2 can include components that are positioned opposite to the components positioned of first computing device 102-1. For example, a first side of the PCB of the first computing device can include components that are taller than a height threshold and a corresponding first side of the PCB of the second computing device can include components that are shorter than the height threshold.

In this way, the relatively taller components from the first computing device 102-1 can positioned toward the relatively shorter components from the second computing device 102-2. In these examples, the first computing device 102-1 can include components positioned on a second side of the PCB that are shorter than the height threshold and the second computing device 102-2 can include components that are taller than the height threshold. In this way, the relatively taller components of the second computing device 102-2 can be positioned toward the relatively shorter components of the first computing device 102-1.

Thus, when the first computing device 102-1 is positioned directly next to the second computing device 102-2 with the components of the first computing device 102-1 directed toward the components of the second computing device 102-2 the overall footprint of the first computing device 102-1 and the second computing device 102-2 can be relatively smaller than other PCB orientations. As used herein, the overall footprint of the first computing device 102-1 and the second computing device 102-2 can include a quantity of space or area that is consumed by the size or shape of the first computing device 102-1 and the second computing device 102-2. In some examples, the overall footprint of the first computing device can be a distance of the relatively tall components of one side of the first computing device 102-1 and a distance of the relatively short components of one side of the second computing device 102-2. In some previous examples, the overall footprint of two computing devices would be a distance of the relatively tall components of both of the two computing devices, which could be larger than the distance of the relatively short components and the distance of the relatively tall components.

In some examples, the first PCB from the first computing device 102-1, the second PCB from the second computing device 102-2, and the plurality of memory resources 106 can be aligned to allow air to flow past from a first side of the computing device enclosure to a second side of the computing device enclosure. For example, the PCB orientations described herein can allow air to be pulled or pushed through the front portion 104 passed the first computing device 102-1, the second computing device 102-2 and/or the plurality of memory resources 106 to the rear portion 108 of the computing device enclosure 100. In some examples, the computing device enclosure 100 can include a cooling system to direct air from the front portion 104 to the rear portion 108 of the storage device drawer. In some examples, the cooling system can include a number of fans that can be utilized to direct the airflow from the front portion 104 to the rear portion 108.

In some examples, the computing device enclosure 100 can include a storage device drawer that includes a first controller printed circuit board (PCB) of the first computing device 102-1 with a first plurality of components positioned on a first side and a second plurality of components positioned on a second side. In these examples, the computing device enclosure 100 can include a second controller PCB of the second computing device 102-2 positioned in parallel with the first controller PCB with a third plurality of components positioned on a first side directed to the first plurality of components and a fourth plurality of components positioned on a second side directed to the second plurality of components. In these examples, the first controller PCB and the second controller PCB are aligned along a first edge of the storage device drawer (e.g., illustrated as the left edge).

In these examples, the computing device enclosure 100 can include a plurality of memory resources 106 aligned along a second edge of the storage device drawer (e.g., illustrated as the right edge) coupled to the first controller PCB through a first fabric and coupled to the second controller PCB through a second fabric. In these examples, the computing device enclosure 100 can include a first input/output (IO) interposer coupled to the first controller PCB and a second IO interposer coupled to the second controller PCB. In some examples, the first IO interposer and the second IO interposer can be positioned at or near the rear portion 108 of the computing device enclosure 100. As used herein, an IO interposer can include an electrical interface routing between a first connection to a second connection.

In some examples, the first edge and the second edge of the storage device drawer extend from a front portion 104 to a rear portion 108 of the storage device drawer. In some examples, the first IO interposer and the second IO interposer are positioned between the rear portion 108 of the storage device drawer and an edge of the first controller PCB of the first computing device 102-1.

Utilizing the PCB orientations of the first computing device 102-1 and the second computing device 102-2 can save space within the computing device enclosure 100. The space that is saved by utilizing the PCB orientations of the first computing device 102-1 and the second computing device 102-2 can be utilized to position additional computing devices and/or memory resources 106 within the computing device enclosure 100. Thus, the PCB orientations can allow for more computing resources (e.g., computing devices, memory resources, cooling resources, etc.) to be positioned within the same physical footprint of the computing device enclosure 100.

Figure 2:
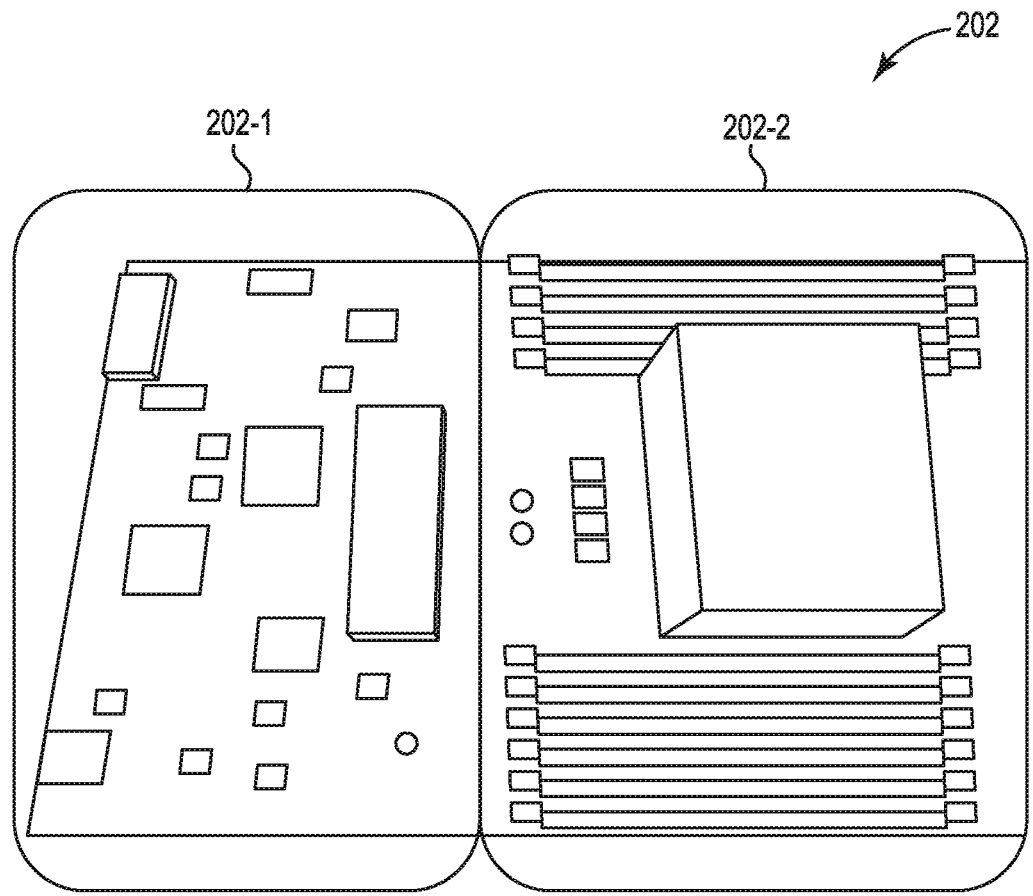
FIG. 2 is an example printed circuit board consistent with the present disclosure.
Figure 2:
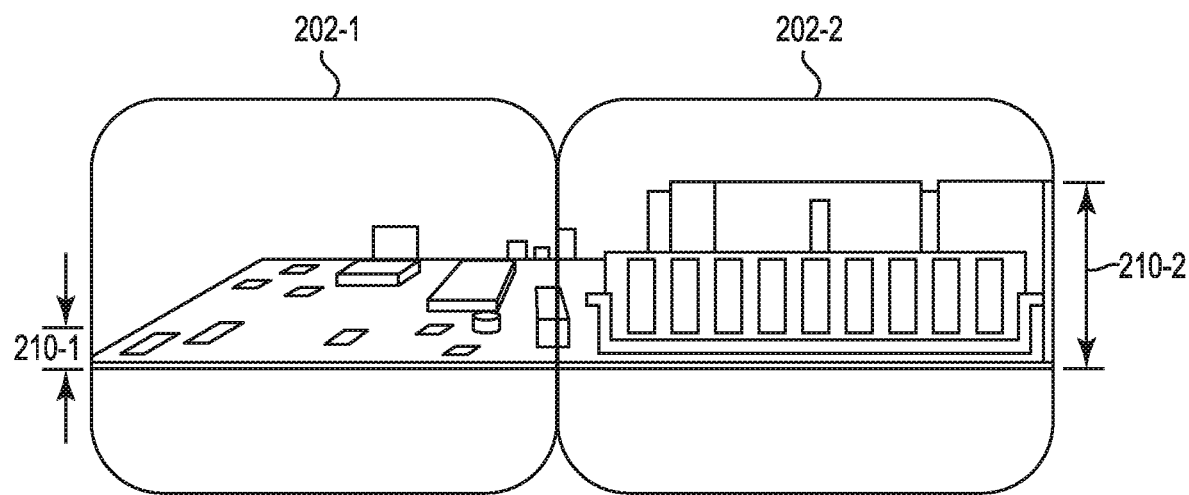

FIG. 2 is an example printed circuit board 202 consistent with the present disclosure. FIG. 2 illustrates a side view of the printed circuit board (PCB) 202 on the right and a top view of the PCB 202 on the left. As used herein, a PCB can be a device to mechanically support and electrically connect electrical components or computing components using conductive material positioned between non-conductive material. In some examples, the PCB 202 can be a portion of a computing device as described herein. For example, the PCB 202 can be a portion of a computing device 102-1, 102-2 as illustrated in FIG. 1.

In some examples, the PCB 202 can be split into a first portion 202-1 and a second portion 202-2. As described herein, the PCB 202 can be split to position components that exceed a height threshold on a first side of the PCB 202 and position components that are below the height threshold on a second side of the PCB 202. In some examples, the components that exceed the height threshold can be considered high profile logic or high profile components and components that are below the height threshold can be considered low profile logic or low profile components.

In some examples, the first portion 202-1 can include components that have a height 210-1 that is shorter than a height threshold and the second portion 202-2 can include components that have a height 210-2 that is taller than the height threshold. In some examples, the height 210-1 can include a range of heights that are below or shorter than the height threshold. In addition, the height 210-2 can include a range of heights that are above or taller than the height threshold. In some examples, a portion of the components positioned on the second portion 202-2 of the PCB 202 can include a height that is below the height threshold, but the first portion 202-1 may be limited to including components that are below the height threshold.

By positioning the components within the first portion 202-1 and the second portion 202-2 of the PCB 202 based on the height threshold, the PCB 202 can be stacked or positioned directly adjacent to a different PCB or different computing device. As described herein, the different PCB can be positioned such that a low profile side of the different PCB corresponds to the second portion 202-2 or high profile side of the PCB 202 and that the high profile side of the different PCB corresponds to the first portion 202-1 or low profile side of the PCB 202. In this way, the orientation of the PCB 202 can be utilized to save physical space by stacking PCBs such that the high profile side is stacked with a low profile side. Thus, more computing devices can be positioned within the same sized computing device enclosure.

Figure 3:
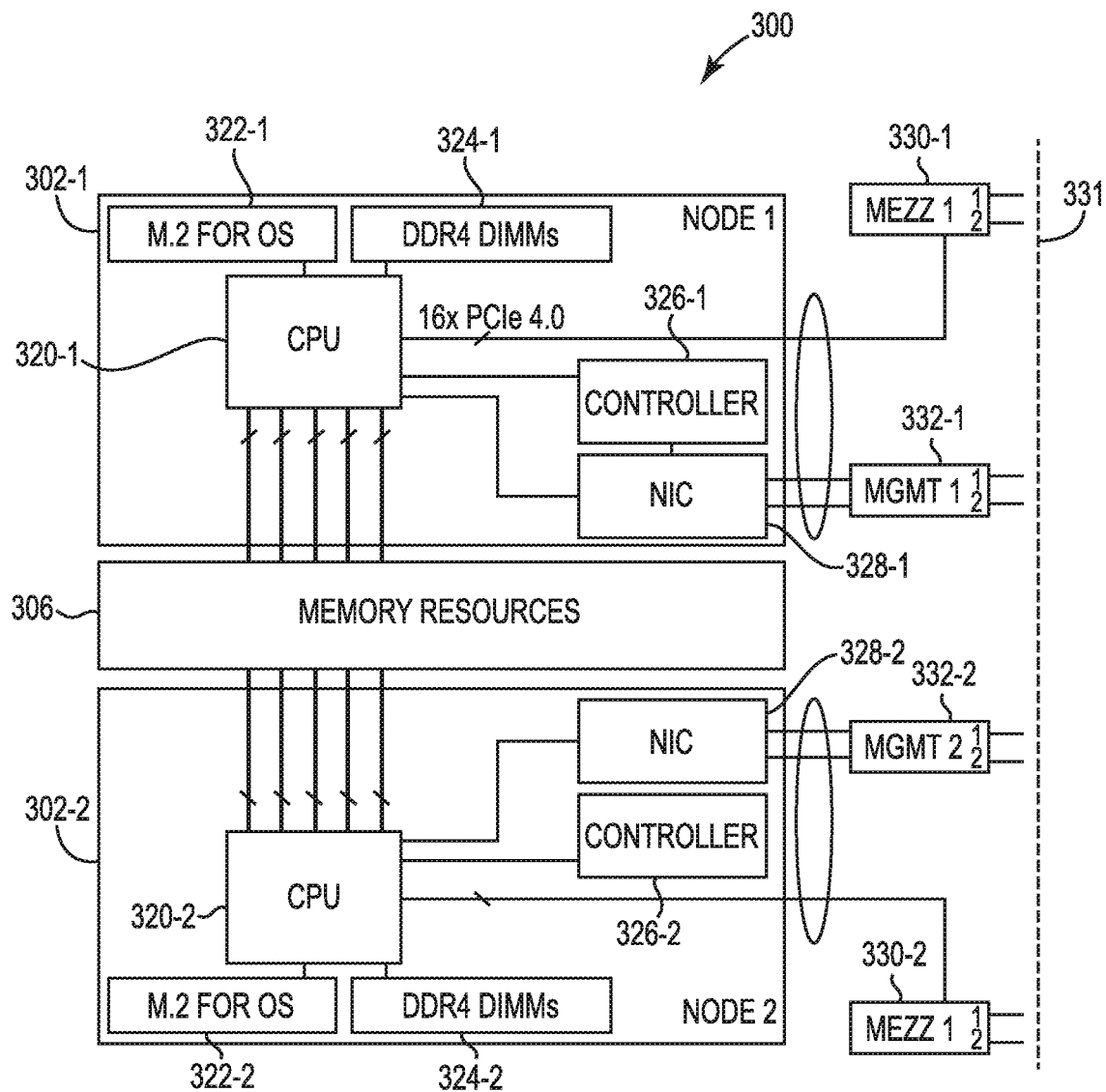
FIG. 3 is an example schematic of a computing device enclosure consistent with the present disclosure.

FIG. 3 is an example schematic of a computing device enclosure 300 consistent with the present disclosure. In some examples, the computing device enclosure 300 can be the same or similar enclosure as computing device enclosure 100 as referenced in FIG. 1. For example, the computing device enclosure 300 can include a first computing device 302-1 and a second computing device 302-2 that are coupled to a plurality of memory resources 306 (e.g., NVMe drives, etc.). In some examples, the first computing device 302-1 and the second computing device 302-2 can be stacked such that a high profile side of the first computing device 302-1 corresponds to a low profile side of the second computing device 302-2.

In some examples, the first computing device 302-1 can include a drive for an operating system (OS) 322-1 and random access memory (RAM) 324-1 coupled to a processing resource 320-1 such as a central processing unit (CPU). In some examples, the processing resource 320-1 can be coupled to a first portion of the plurality of memory resources 306. In some examples, the first computing device 302-1 can be utilized to manage the first portion of the plurality of memory resources 306. For example, the first computing device 302-1 can be utilized to manage the storage and retrieval of data from the first portion of the plurality of memory resources 306.

In some examples, the processing resource 320-1 can be coupled to a number of additional components such as, but not limited to: a controller 326-1, a network interface card (NIC) 328-1, a mezzanine 330-1, a management node 332-1, and/or the midplane 331. These components can be utilized to manage the first portion of the plurality of memory resources 306.

In some examples, the second computing device 302-2 can include a drive for an operating system (OS) 322-2 and random access memory (RAM) 324-2 coupled to a processing resource 320-2 such as a central processing unit (CPU). In some examples, the processing resource 320-2 can be coupled to a second portion of the plurality of memory resources 306. In some examples, the second computing device 302-2 can be utilized to manage the second portion of the plurality of memory resources 306. For example, the second computing device 302-2 can be utilized to manage the storage and retrieval of data from the second portion of the plurality of memory resources 306.

In some examples, the processing resource 320-2 can be coupled to a number of additional components such as, but not limited to: a controller 326-2, a network interface card (NIC) 328-2, a mezzanine 330-2, a management node 332-2, and/or the midplane 331. These components can be utilized to manage the second portion of the plurality of memory resources 306.

Figure 4:
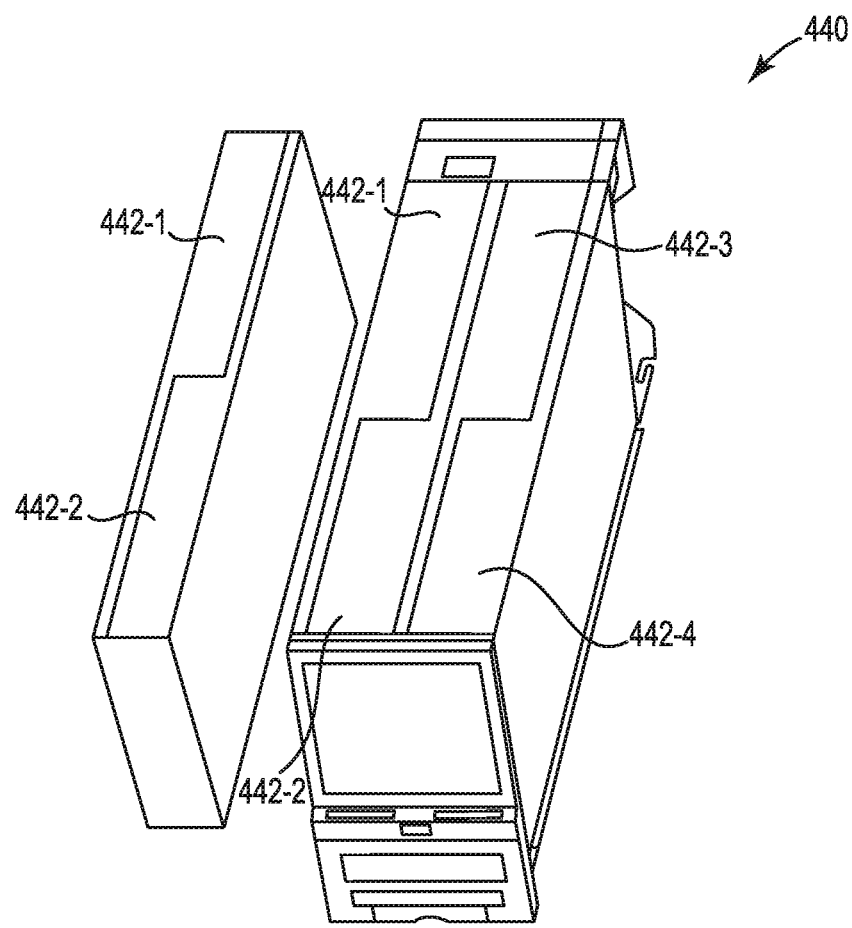
FIG. 4 is an example of a computing device enclosure consistent with the present disclosure.
Figure 4:
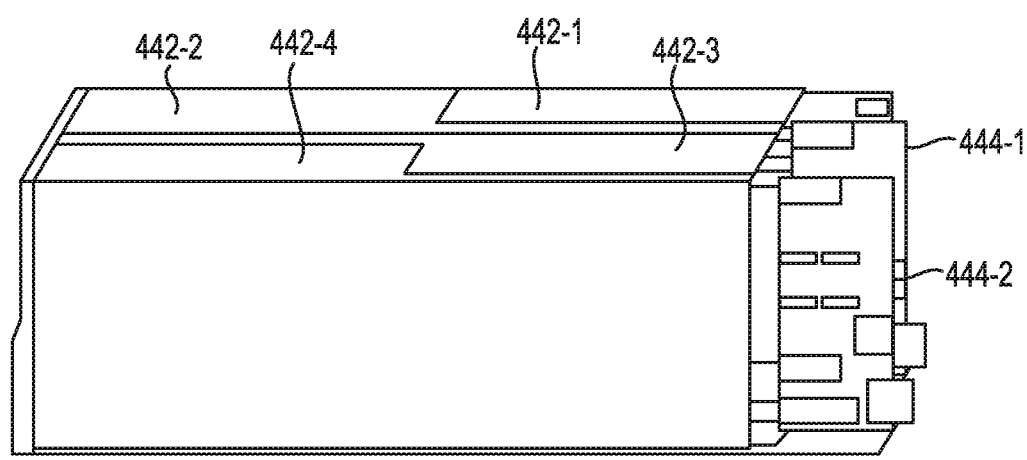

FIG. 4 is an example of a computing device enclosure 440 consistent with the present disclosure. In some examples, the computing device enclosure 440 can be a similar enclosure to computing device enclosure 100 as illustrated in FIG. 1. For example, the computing device enclosure 440 can be a drawer enclosure that utilizes a rail system to slide the computing device enclosure 440 into a rack during operation and to slide the computing device enclosure 440 out of the rack during maintenance.

In some examples, the computing device enclosure 440 can include a plurality of computing devices 442-1, 442-2, 442-3, 442-4. In some examples, the plurality of computing devices 442-1, 442-2, 442-3, 442-4 can be computing devices that are utilized by remote devices. For example, the plurality of computing devices 442-1, 442-2, 442-3, 442-4 can be servers. As used herein, a server can be a computing device storing instructions that can be executed by a processing resource to provide a functionality for other devices or applications.

In some examples, the computing device enclosure 440 can include a first computing device 442-1 that includes a first printed circuit board (PCB) that includes a first plurality of components. In some examples, a first portion of the first plurality of components are shorter than a threshold height and are positioned on a first side of the first PCB and a second portion of the first plurality of components that are taller than the threshold height are positioned on a second side of the first PCB. In some examples, the computing device enclosure 440 can include a second computing device 442-2 that includes a second printed circuit board (PCB) that includes a second plurality of components. In some examples, a first portion of the second plurality of components that are shorter than the threshold height are positioned on a first side of the second PCB and a second portion of the second plurality of components that are taller than the threshold height are positioned on a second side of the second PCB. In these examples, the first side of the first PCB is positioned along the second side of the second PCB and the second side of the first PCB is positioned along the first side of the second PCB. In these examples, the first PCB and the second PCB are positioned in parallel with the first plurality of components directed toward the second plurality of components. As described herein, the first PCB of the first computing device 442-1 can be sandwiched with the second PCB of the second computing device 442-2 such that the components coupled to the first PCB are directed toward the components coupled to the second PCB.

In some examples, the plurality of computing devices 442-1, 442-2, 442-3, 442-4 can be organized in a similar orientation as the PCB 202 as referenced in FIG. 2 and/or computing devices 102-1, 102-2 as referenced in FIG. 1. For example, the PCB of a first computing device 442-1 can include a first side with components that are taller than a threshold height and a second side with components that are shorter than the threshold height. In this way, the first computing device 442-1 can be positioned directly adjacent to the second computing device 442-2 such that a high profile side (e.g., side of PCB that includes components that exceed the height threshold, etc.) of the first computing device 442-1 is aligned with a low profile side (e.g., side of PCB that includes components that are below the height threshold, etc.) of the second computing device 442-2. In a similar way, a third computing device 442-3 can be positioned directly adjacent to the fourth computing device 442-4 such that a low profile side of the third computing device 442-3 is aligned with a high profile side of the fourth computing device 442-4. In this way, the overall physical footprint of the plurality of computing devices 442-1, 442-2, 442-3, 442-4 can be less than previous system orientations. Thus, more computing devices can be positioned within the same sized computing device enclosure 440.

In some examples, the computing device enclosure 440 can include a first input/output (IO) interposer 444-1 and a second IO interposer 444-2. As used herein, an IO interposer can include an electrical interface routing between a first connection to a second connection. In some examples, the first IO interposer 444-1 can be utilized by the first computing device 442-1 and the second computing device 442-2 while the second IO interposer 444-2 can be utilized by the third computing device 442-3 and fourth computing device 442-4. In some examples, the PCB of the second computing device 442-2 can be directly adjacent to the PCB of the third computing device 442-3.

Utilizing the PCB orientations of the computing devices 442-1, 442-2, 442-3, 442-4 can save space within the computing device enclosure 440. The space that is saved by utilizing the PCB orientations of the computing devices 442-1, 442-2, 442-3, 442-4 can be utilized to position additional computing devices within the computing device enclosure 440 compared to previous systems and devices. Thus, the PCB orientations can allow for more computing resources (e.g., computing devices, memory resources, cooling resources, etc.) to be positioned within the same physical footprint of the computing device enclosure 440.

Figure 5:
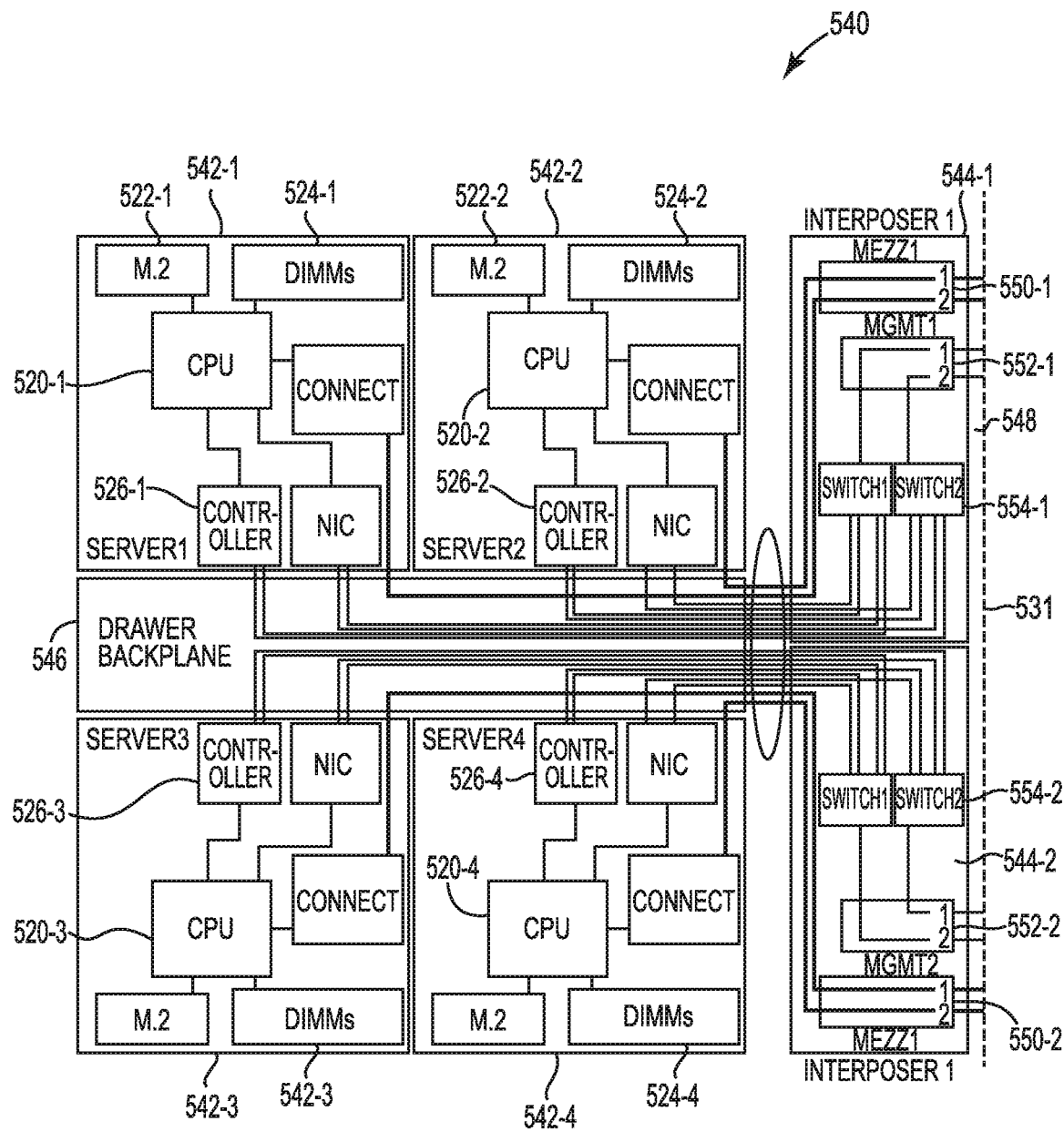
FIG. 5 is an example schematic of a computing device enclosure consistent with the present disclosure.

FIG. 5 is an example schematic of a computing device enclosure 540 consistent with the present disclosure. In some examples, the computing device enclosure 540 can be the same or similar enclosure as computing device enclosure 440 as referenced in FIG. 4. For example, the computing device enclosure 540 can include a first computing device 542-1, a second computing device 542-2, a third computing device 542-3, and a fourth computing device 542-4 that are coupled to a drawer backplane 546. In some examples, the first computing device 542-1, the second computing device 542-2, the third computing device 542-3, and the fourth computing device 542-4 can be stacked such that a high profile side of one computing device corresponds to a low profile side of a different computing device.

In some examples, the first computing device 542-1 can include a drive for an operating system (OS) 522-1 and random access memory (RAM) 524-1 coupled to a processing resource 520-1 such as a central processing unit (CPU). In some examples, the processing resource 520-1 can be coupled to a controller 526-1 that is coupled to the drawer backplane 546. As used herein, a drawer backplane 546 can include a main circuit board that interconnect a plurality of computing devices (e.g., computing devices 542-1, 542-2, 542-3, 542-4, etc.). For example, the drawer backplane 546 can be utilized to couple the plurality of computing devices 542-1, 542-2, 542-3, 542-4 to a first interposer 544-1 and/or a second interposer 544-2.

In some examples, the processing resource 520-1 can be coupled to a number of additional components through the drawer backplane 546 such as, but not limited to: a number of switches 554-1, a mezzanine 550-1, a management node 552-1, and/or the midplane 531. These components can be utilized to provide a service utilizing the computing resources of the first computing device 542-1.

In some examples, the second computing device 542-2 can include a drive for an operating system (OS) 522-2 and random access memory (RAM) 524-2 coupled to a processing resource 520-2 such as a central processing unit (CPU). In some examples, the processing resource 520-2 can be coupled to a controller 526-2 that is coupled to the drawer backplane 546. In some examples, the drawer backplane 546 can be utilized to couple the second computing device 542-2 to a first interposer 544-1 and/or a second interposer 544-2.

In some examples, the processing resource 520-2 can be coupled to a number of additional components through the drawer backplane 546 such as, but not limited to: a number of switches 554-1, a mezzanine 550-1, a management node 552-1, and/or the midplane 531. These components can be utilized to provide a service utilizing the computing resources of the second computing device 542-2.

In some examples, the third computing device 542-3 can include a drive for an operating system (OS) 522-3 and random access memory (RAM) 524-3 coupled to a processing resource 520-3 such as a central processing unit (CPU). In some examples, the processing resource 520-3 can be coupled to a controller 526-3 that is coupled to the drawer backplane 546. In some examples, the drawer backplane 546 can be utilized to couple the third computing device 542-3 to a first interposer 544-1 and/or a second interposer 544-2.

In some examples, the processing resource 520-3 can be coupled to a number of additional components through the drawer backplane 546 such as, but not limited to: a number of switches 554-1, a mezzanine 550-1, a management node 552-1, and/or the midplane 531. These components can be utilized to provide a service utilizing the computing resources of the third computing device 542-3.

In some examples, the fourth computing device 542-4 can include a drive for an operating system (OS) 522-4 and random access memory (RAM) 524-4 coupled to a processing resource 520-4 such as a central processing unit (CPU). In some examples, the processing resource 520-4 can be coupled to a controller 526-4 that is coupled to the drawer backplane 546. In some examples, the drawer backplane 546 can be utilized to couple the fourth computing device 542-4 to a first interposer 544-1 and/or a second interposer 544-2.

In some examples, the processing resource 520-4 can be coupled to a number of additional components through the drawer backplane 546 such as, but not limited to: a number of switches 554-1, a mezzanine 550-1, a management node 552-1, and/or the midplane 531. These components can be utilized to provide a service utilizing the computing resources of the fourth computing device 542-4. As described herein, the computing device enclosure 540 can be utilized to store and utilize more computing devices compared to previous devices and systems. By utilizing more computing devices within the same physical footprint, the computing device enclosure 540 can provide more computing resources compared to previous devices and system that are not capable of storing and utilizing the same number of computing devices.

Figure 6:
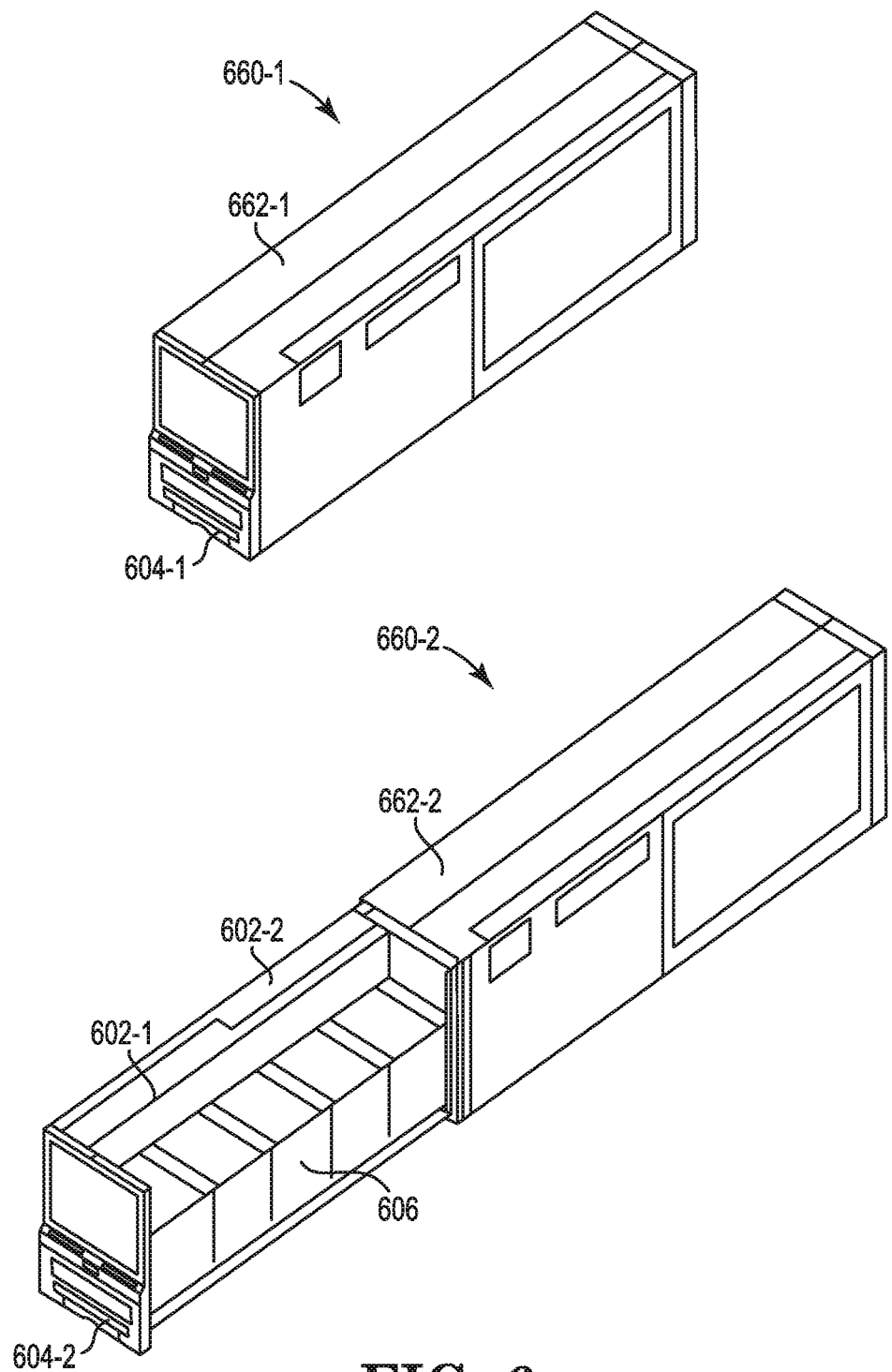
FIG. 6 is an example computing device enclosure consistent with the present disclosure.

FIG. 6 is an example computing device enclosure 660-1, 660-2 consistent with the present disclosure. FIG. 6 illustrates a computing device enclosure 660-1 in a closed position and a computing device enclosure 660-2 in an open position. In some examples, the computing device enclosure 660-1, 660-2 can include the same or similar elements as computing device enclosure 100 as illustrated in FIG. 1, computing device enclosure 300 as referenced in FIG. 3, computing device enclosure 440 as referenced in FIG. 4, and/or computing device enclosure 540 as referenced in FIG. 5.

In some examples, the computing device enclosure 660-1 can illustrate a drawer computing device enclosure in a closed position with the front portion 604-1, 604-2 exposed while computing devices 602-1, 602-2 and/or memory resources 606 being positioned within an exterior enclosure 662-1, 662-2. As described herein, the computing device enclosure 660-2 can illustrate a drawer computing device enclosure in an open position to provide access to the computing devices 602-1, 602-2 and/or memory resources 606.

In some examples, the interior portion of the enclosure can include rails to move the interior portion of the enclosure into the exterior enclosure 662-1, 662-2 and to move the interior portion of the enclosure out of the exterior enclosure 662-1, 662-2. In some examples, the interior portion of the enclosure can include a cable track with cables to ensure that the interior portion of the drawer is not completely removable from the exterior enclosure 662-1, 662-2. For example, the cable track and/or cables can prevent the interior enclosure from intentionally or accidentally being removed from the exterior enclosure 662-1, 662-2. In this way, the interior portion is not completely disconnected from the exterior enclosure 662-1, 662-2, which can maintain electrical connections with the devices positioned within the interior portion. For example, a power connection can be provided to the computing devices 602-1, 602-2 and/or memory resources 606 through the exterior enclosure 662-1, 662-2. In this example, the electrical power provided through the power connection can be provided to the computing devices 602-1, 602-2 and/or memory resources 606 when the interior portion is exposed as illustrated by computing device enclosure 660-2. Thus, an intentional or accidental removal of the interior portion could cause a disconnection of the electrical power through the power connection, which may cause problems with the computing devices 602-1, 602-2 and/or memory resources 606.

In some examples, the computing device enclosure 660-1, 660-2 can be a system that includes an enclosure with a removable drawer. In these examples, the drawer can include a plurality of hot pluggable connections on a base with an aperture to access the plurality of hot pluggable connections. In these examples, the computing device enclosure 660-1, 660-2 can be a system that includes a first computing device 602-1 positioned in parallel with a second computing device 602-2 within the drawer when the first computing device 602-1 and the second computing device 602-2 are coupled to corresponding hot pluggable connections within the drawer. In these examples, a first plurality of components from the first computing device 602-1 are directed towards the second computing device 602-2 and a second plurality of components from the second computing device 602-2 are directed towards the first computing device 602-1.

As illustrated in FIG. 4, some examples can include a third computing device positioned in parallel with the first computing device 602-1 and the second computing device 602-2 when the third computing device is coupled to a corresponding hot pluggable connection within the drawer. In addition, some examples can include a fourth computing device positioned in parallel with the first computing device 602-1 and the second computing device 602-2 when the third computing device is coupled to a corresponding hot pluggable connection within the drawer. In these examples, a third plurality of components of the third computing device can be directed away from the second computing device 602-2 and toward the fourth computing device and wherein a fourth plurality of components of the fourth computing device are directed toward the third computing device. Furthermore, in these examples, the computing devices and/or memory resources 606 can be individually removeable from the removable drawer through the aperture positioned at the top as illustrated by computing device enclosure 660-2.

In some examples, a first controller PCB of a first computing device 602-1, a second controller PCB of a second computing device 602-2, a plurality of memory resources 606, a first IO interposer, and a second 10 interposer can be accessible from a top portion of the storage device drawer when the storage device drawer is in an open position as illustrated by computing device enclosure 660-2. In some examples, the first controller PCB of the first computing device 602-1, the second controller PCB of the second computing device 602-2, the plurality of memory resources 602, the first IO interposer, and the second 10 interposer are hot pluggable into corresponding sockets from a top portion of the storage device drawer when the storage device drawer is in an open position as illustrated by computing device enclosure 660-2. In some examples, the computing devices 602-1, 602-2 and/or the memory resources 606 can be aligned in parallel to allow air to flow from a front portion 604-1, 604-2 of the removable drawer to a rear portion of the removable drawer. In some examples, the computing devices 602-1, 602-2 and/or the memory resources 606 can be coupled to a backplane of the enclosure through the plurality of hot pluggable connections.

FIG. 6 illustrates computing devices 602-1, 602-2 and memory resources 606 positioned within the interior portion of the enclosure (e.g., a removable tray, etc.). However, the interior portion of the enclosure can also be utilized to store a plurality of computing devices to be utilized as servers. For example, the interior portion of the enclosure can be utilized to store computing device 442-1, 442-2, 442-3, 442-4 as referenced in FIG. 4.

Figure 7:
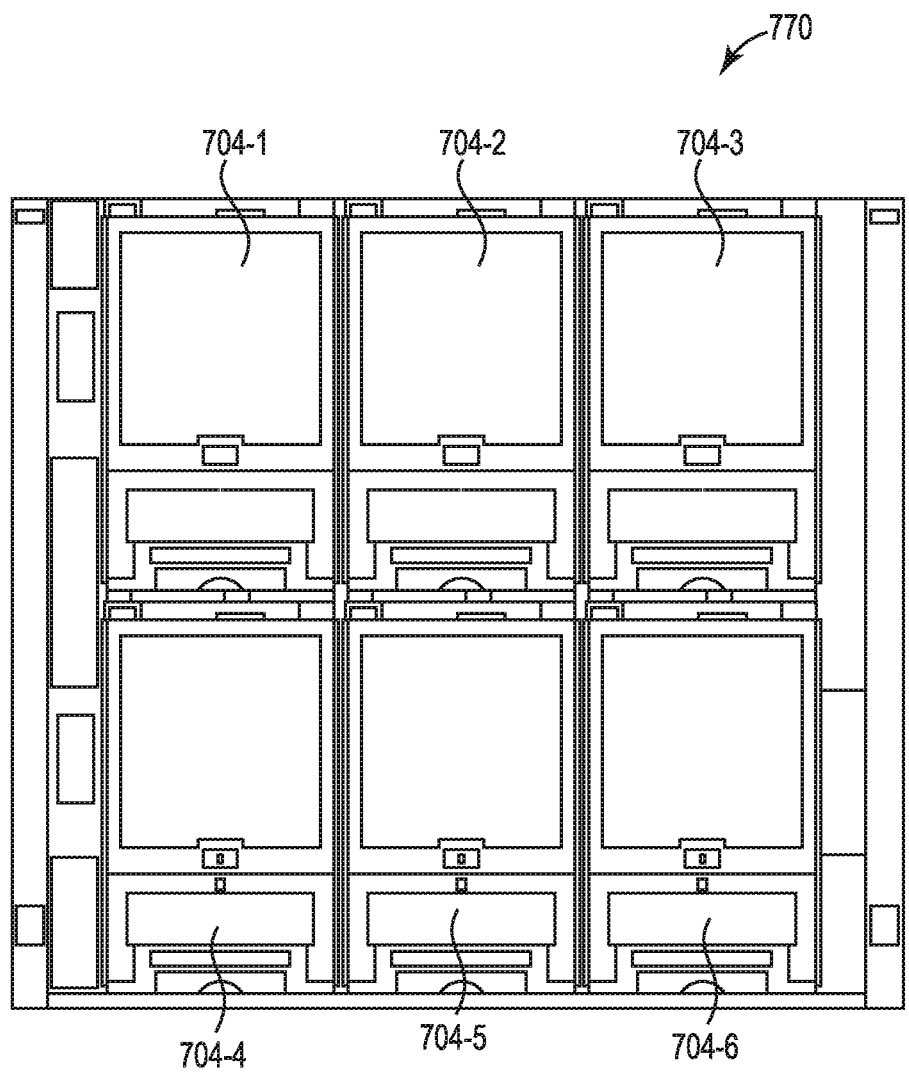
FIG. 7 is an example system for computing device enclosures consistent with the present disclosure.

FIG. 7 is an example system 770 for computing device enclosures consistent with the present disclosure. In some examples, the system 770 can illustrate a rack that can be utilized to store a plurality of computing device enclosures as described herein. For example, the system 770 can illustrate a rack that can store a plurality of computing device enclosures as illustrated in FIG. 1, FIG. 4, and FIG. 6. FIG. 7 illustrates a plurality of front portions 704-1, 704-2, 704-3, 704-4, 704-5, 704-6 of a plurality of corresponding computing device enclosures.

As described herein, the system 770 illustrates drawers that can house the computing devices and/or memory resources. However, in some examples the system 770 can be a blade enclosure. In some examples, a blade enclosure can be a rack that can store a plurality of server modules described as "blades" or "server blades". In some examples, the blade enclosure can be utilized to manage performance of the plurality of server modules in a similar way that a drawer enclosure can store and manage performance of the computing devices. A blade enclosure or drawer enclosure can each be utilized to store and manage computing devices. In some examples, the system 770 can include a plurality of drawers and a plurality of blades within the same system 770. For example, a front portion 704-1 can include an area with a corresponding drawer enclosure and a front portion 704-2 can be replaced with one or two blades.

In some examples, the plurality of front portions 704-1, 704-2, 704-3, 704-4, 704-5, 704-6 of the plurality of corresponding drawer enclosures can be approximately a width of two blades or server blades. For example, the width of the front portion 704-1 can be equal to the width of two server blades. In some examples, the plurality of front portions 704-1, 704-2, 704-3, 704-4, 704-5, 704-6 of the plurality of corresponding drawer enclosures can be approximately the height of a "half-height server blade". As used herein, a half-height server blade can include a server blade that is approximately half of the height of a standard server blade. Since there are a plurality of server blade manufacturers, there has been a move to a standard height of the server blade, such that a server blade rack can be utilized to store and manage a plurality of different server blades from different manufacturers.

As described herein, the plurality of computing device enclosures can each include a plurality of computing devices and/or memory resources as described herein. In some examples a first portion of the plurality of computing device enclosures can include servers as illustrated in FIG. 4 and a second portion of the plurality of computing device enclosures can include computing devices and memory resources as illustrated in FIG. 1. As described herein, the computing devices can be positioned within the computing device enclosure such that a high profile portion of a first computing device corresponds to a low profile portion of an adjacent second computing device to allow for more computing resources to be positioned within the same physical footprint. In this way, each of the plurality of computing device enclosures can store and utilize more computing devices or computing resources compared to previous computing device enclosures.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure and should not be taken in a limiting sense. Further, as used herein, "a number of" an element and/or feature can refer to any number of such elements and/or features.

What is claimed:

1. A computing device enclosure, comprising:
a removable drawer including a plurality of hot pluggable connections on a base with an aperture to access the plurality of hot pluggable connections;
a first printed circuit board (PCB) that includes a first plurality of components, wherein a first portion of the first plurality of components that are shorter than a threshold height are positioned on a first side of the first PCB and a second portion of the first plurality of components that are taller than the threshold height are positioned on a second side of the first PCB;
a second printed circuit board (PCB) that includes a second plurality of components, wherein a first portion of the second plurality of components that are shorter than the threshold height are positioned on a first side of the second PCB and a second portion of the second plurality of components that are taller than the threshold height are positioned on a second side of the second PCB;
a third printed circuit board and a fourth printed circuit board,
wherein each of the first, second, third, and fourth printed circuit boards are coupled to a corresponding hot pluggable connection and are parallel with each other.

2. The computing device enclosure of claim 1, wherein the first PCB and the second PCB are positioned with the first plurality of components directed toward the second plurality of components.

3. The computing device enclosure of claim 1, wherein the first PCB is a first controller for a plurality of memory resources and the second PCB is a second controller for the plurality of memory resources.

4. The computing device enclosure of claim 3, wherein the first PCB is coupled to the plurality of memory resources through a first fabric and the second PCB is coupled to the plurality of memory resources through a second fabric.

5. The computing device enclosure of claim 3, wherein the plurality of memory resources are hot pluggable non-volatile memory express (NVMe) memory resources.

6. The computing device enclosure of claim 3, wherein the plurality of memory resources are positioned within the removable drawer that allows access to the the plurality of memory resources.

7. The computing device enclosure of claim 3, wherein the first PCB, second PCB, and plurality of memory resources are aligned to allow air to flow past from a first side of the computing device enclosure to a second side of the computing device enclosure.

8. A storage device drawer, comprising:
a plurality of hot pluggable connections with an aperture to access the plurality of hot pluggable connections;
a first controller printed circuit board (PCB) with a first plurality of components positioned on a first side and a second plurality of components positioned on a second side;
a second controller PCB positioned in parallel with the first controller PCB with a third plurality of components positioned on a first side directed to the first plurality of components and a fourth plurality of components positioned on a second side directed to the second plurality of components, wherein the first controller PCB and the second controller PCB are aligned along a first edge of the storage device drawer;
a third controller PCB positioned in parallel with the first controller PCB;
a fourth controller PCB positioned in parallel with the first controller PCB, wherein each of the first, second, third, and fourth controller PCB are coupled to a corresponding hot pluggable connection;
a plurality of memory resources aligned along a second edge of the storage device drawer coupled to the first controller PCB through a first fabric and coupled to the second controller PCB through a second fabric; and
a first input/output (IO) interposer coupled to the first controller PCB and a second IO interposer coupled to the second controller PCB.

9. The storage device drawer of claim 8, wherein the first edge and the second edge of the storage device drawer extend from a front portion to a rear portion of the storage device drawer.

10. The storage device drawer of claim 9, wherein the first IO interposer and the second IO interposer are positioned between the rear portion of the storage device drawer and an edge of the first controller PCB.

11. The storage device drawer of claim 9, comprising a cooling system to direct air from the front portion to the rear portion of the storage device drawer.

12. The storage device drawer of claim 8, wherein the first controller PCB, the second controller PCB, the plurality of memory resources, the first IO interposer, and the second IO interposer are accessible from a top portion of the storage device drawer when the storage device drawer is in an open position.

13. A system comprising:
an enclosure with a removable drawer, wherein the drawer includes a plurality of hot pluggable connections on a base with an aperture to access the plurality of hot pluggable connections;
a first computing device positioned in parallel with a second computing device within the drawer when the first computing device and the second computing device are coupled to corresponding hot pluggable connections within the drawer, wherein a first plurality of components from the first computing device are directed towards the second computing device and a second plurality of components from the second computing device are directed towards the first computing device;
a third computing device positioned in parallel with the first computing device and the second computing device when the third computing device is coupled to a corresponding hot pluggable connection within the drawer; and
a fourth computing device positioned in parallel with the first computing device and the second computing device when the third computing device is coupled to a corresponding hot pluggable connection within the drawer.

14. The system of claim 13, wherein a third plurality of components of the third computing device are directed away from the second computing device and toward the fourth computing device and wherein a fourth plurality of components of the fourth computing device are directed toward the third computing device.

15. The system of claim 13, comprising:
a first input/output (TO) interposer coupled to the first and second computing devices; and
a second IO interposer coupled to the third and fourth computing devices.

16. The system of claim 13, wherein the first, second, third, and fourth computing devices are individually removeable from the removable drawer through the aperture.

17. The system of claim 13, wherein the first, second, third, and fourth computing devices are aligned in parallel to allow air to flow from a front portion of the removable drawer to a rear portion of the removable drawer.

18. The system of claim 13, wherein the first, second, third, and fourth computing devices are coupled to a backplane of the enclosure through the plurality of hot pluggable connections.

* * * * *